(12) United States Patent
Taylor et al.

(10) Patent No.: US 9,974,209 B1
(45) Date of Patent: May 15, 2018

(54) HEAT SINK AND METHOD

(71) Applicant: Rapid Heat Sinks, LLC., Myakka City, FL (US)

(72) Inventors: Alan Taylor, Myakka City, FL (US); Tony Quirke, Myakka City, FL (US)

(73) Assignee: Taylor & Lego Holdings, LLC, Sarasota, FL (US)

( * ) Notice: Subject to any disclaimer, the term of this patent is extended or adjusted under 35 U.S.C. 154(b) by 385 days.

(21) Appl. No.: 14/710,490

(22) Filed: May 12, 2015

Related U.S. Application Data

(60) Provisional application No. 61/992,046, filed on May 12, 2014, provisional application No. 62/062,699, filed on Oct. 10, 2014.

(51) Int. Cl.
| | | |
|---|---|---|
| *B29C 33/02* | (2006.01) | |
| *H01L 23/373* | (2006.01) | |
| *H05K 7/20* | (2006.01) | |
| *B23P 15/26* | (2006.01) | |

(52) U.S. Cl.
CPC .......... *H05K 7/20418* (2013.01); *B23P 15/26* (2013.01)

(58) Field of Classification Search
CPC ..... H05K 7/20418; B23P 15/26; B29C 70/54; B29C 70/443; B29K 2063/00
See application file for complete search history.

(56) References Cited

U.S. PATENT DOCUMENTS

| | | | |
|---|---|---|---|
| D770,940 S | 11/2016 | Taylor | |
| 2010/0119634 A1* | 5/2010 | Choiniere | B29C 33/442 425/89 |

OTHER PUBLICATIONS

U.S. Appl. No. 29/583,529, Alan Taylor.
U.S. Appl. No. 61/992,142, Alan Taylor.
U.S. Appl. No. 62/062,708, Alan Taylor.
U.S. Appl. No. 62/129,318, Alan Taylor.
U.S. Appl. No. 14/710,306, Alan Taylor.
U.S. Appl. No. 62/034,948, Alan Taylor.
U.S. Appl. No. 14/821,139, Alan Taylor.

* cited by examiner

*Primary Examiner* — David Bryant
*Assistant Examiner* — Lee A Holly
(74) *Attorney, Agent, or Firm* — Frijouf, Rust & Pyle, P.A.

(57) ABSTRACT

A heat sink is disclosed comprising a metallic pin extending between a proximal end and a distal end. A lower pin stud is positioned adjacent to the proximal end. An upper pin stud is positioned adjacent to the distal end. A base flange is interposed between the lower pin stud and the upper pin stud and defines a lower base surface and an upper base surface. The lower pin stud engages a source aperture and the lower base surface engages a source surface. A composite pitch fiber encapsulates the upper pin stud and the upper base surface. The metallic pin and the composite pitch fiber transfer the thermal energy from the lower pin stud and the lower base surface, through the upper pin stud and through the composite pitch fiber for dissipating the thermal energy from the source.

1 Claim, 18 Drawing Sheets

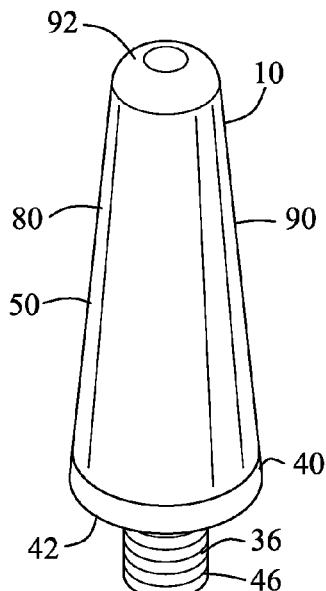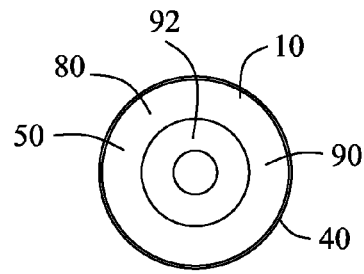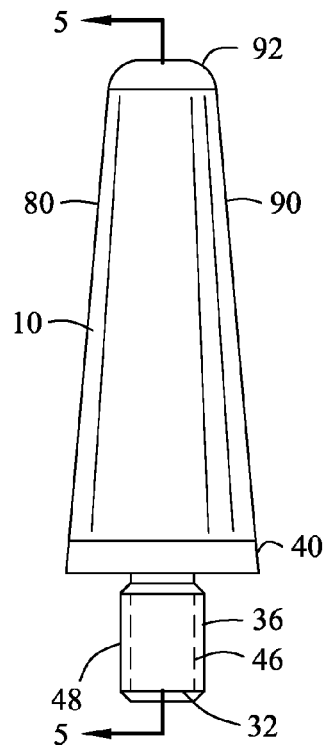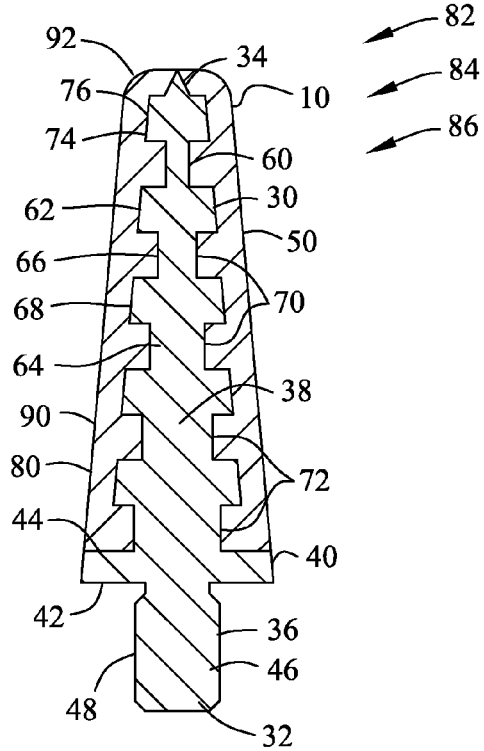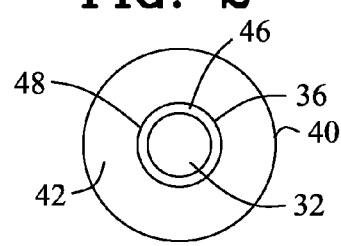
FIG. 1
FIG. 2
FIG. 3
FIG. 4
FIG. 5

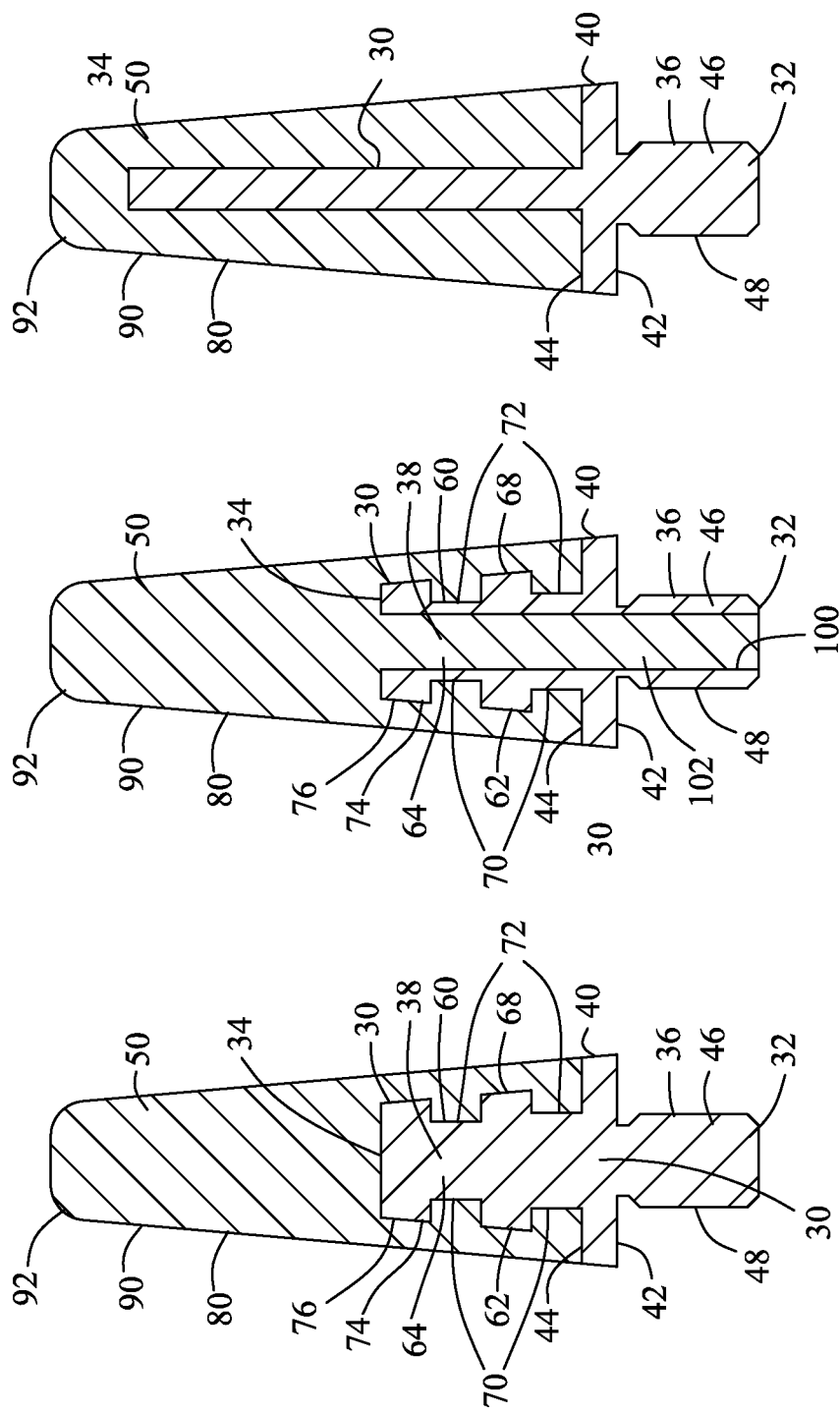

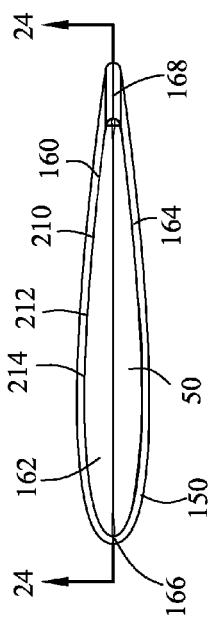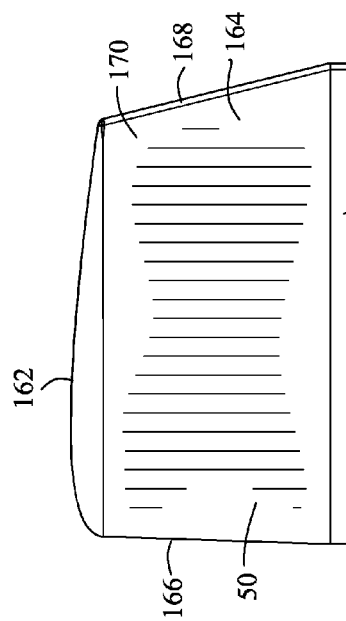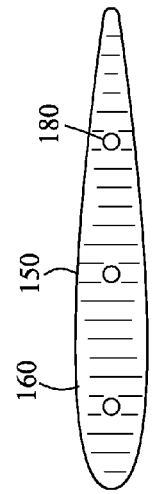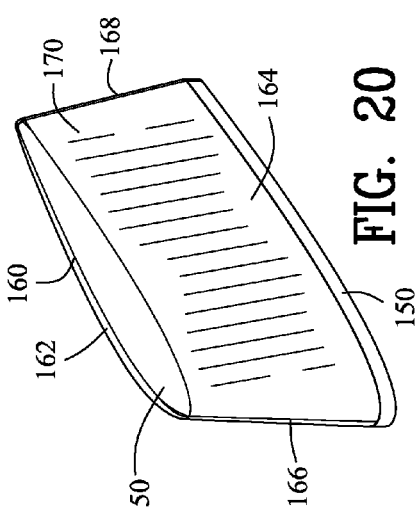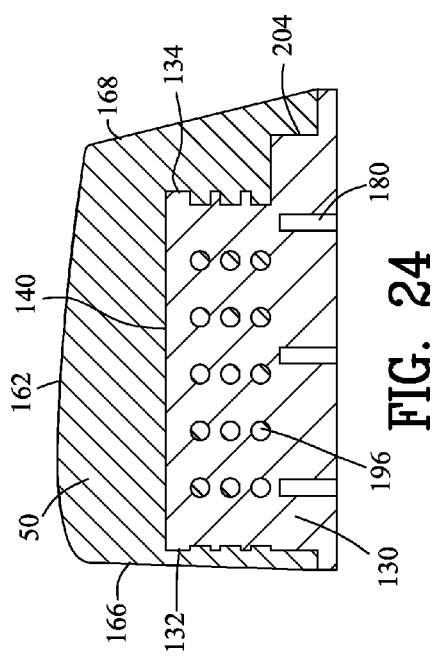

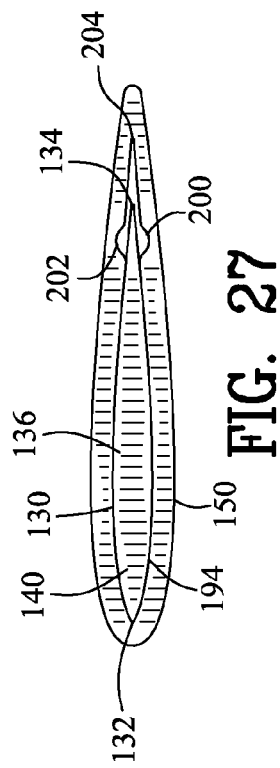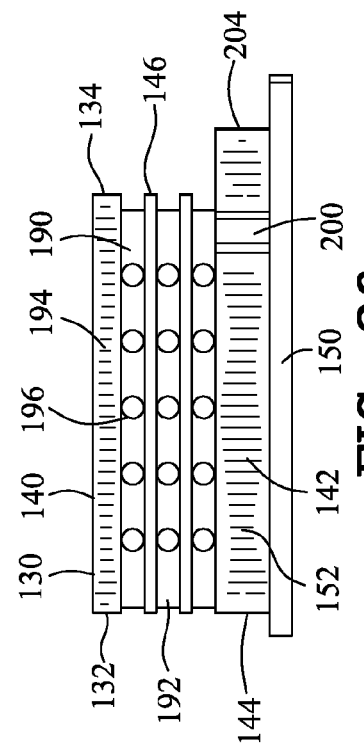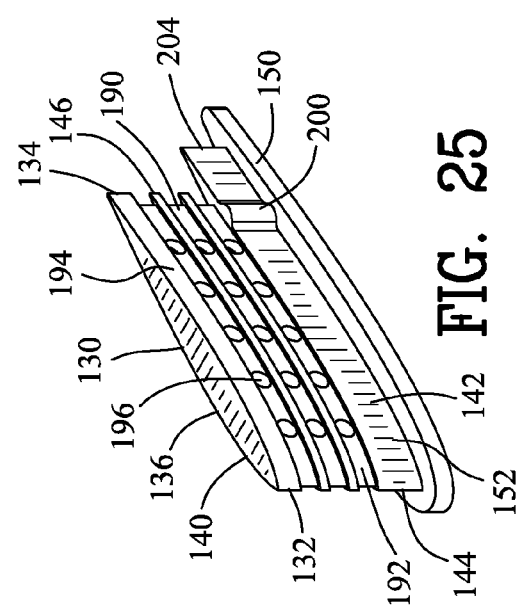

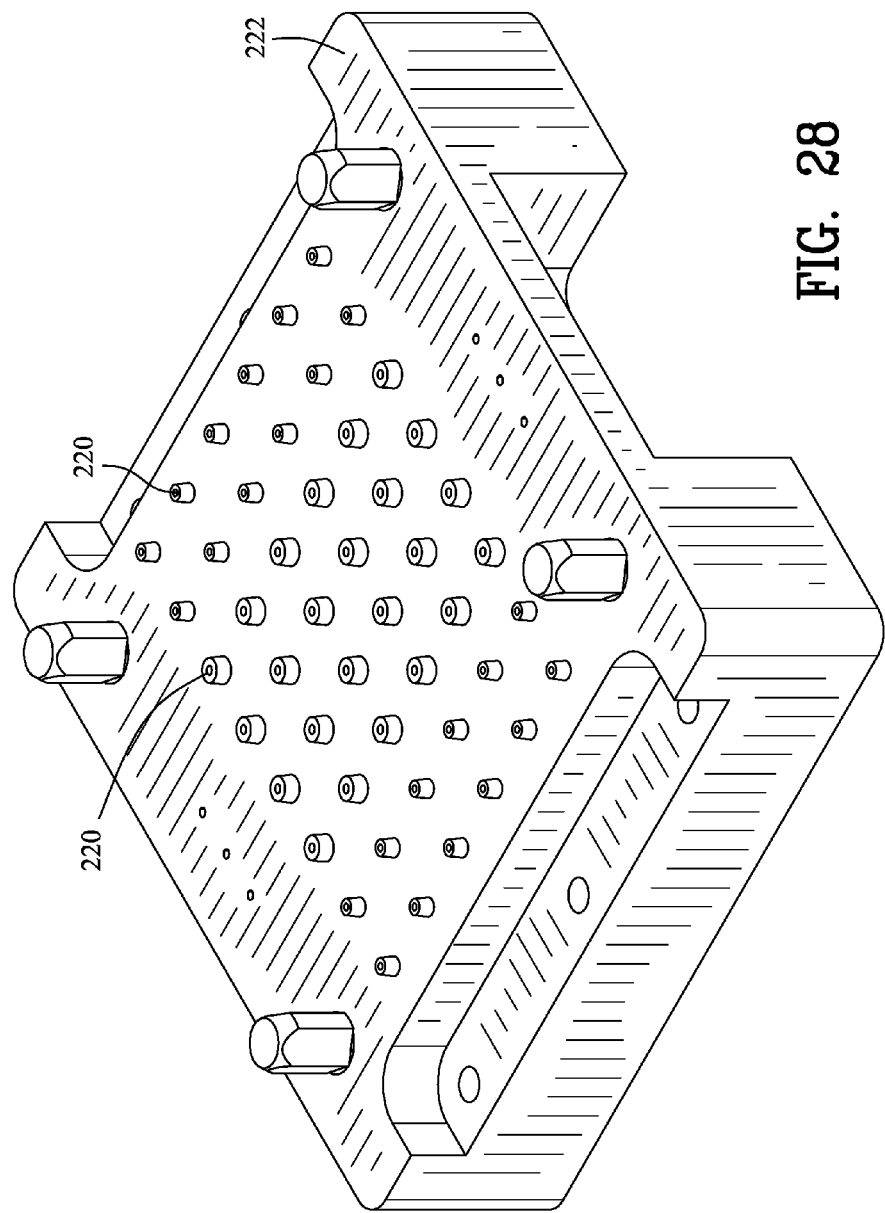

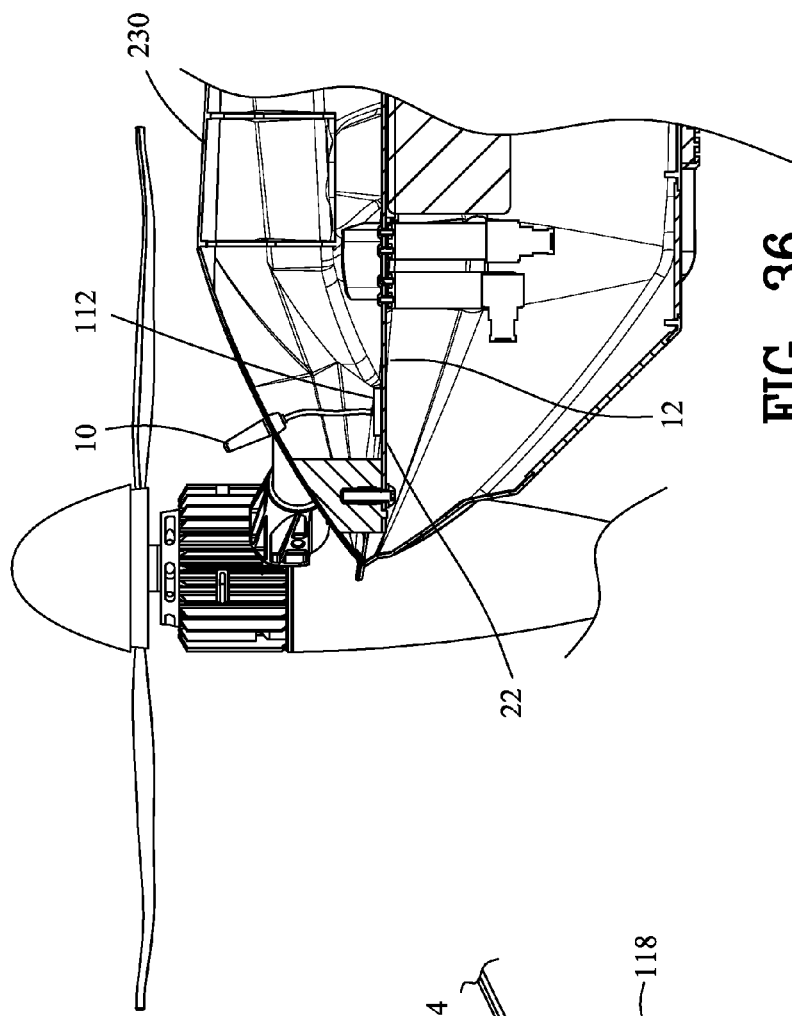
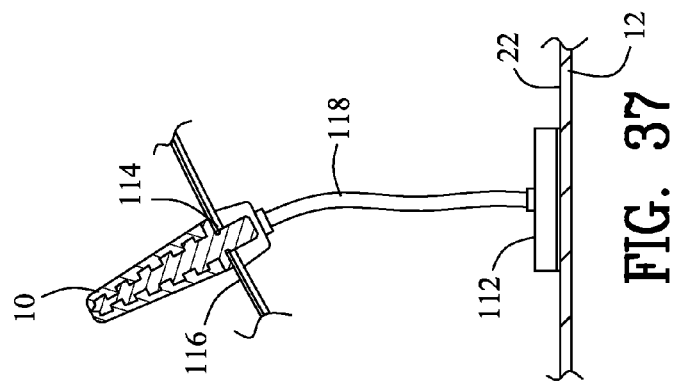

HEAT SINK AND METHOD

CROSS-REFERENCE TO RELATED APPLICATIONS

This application claims benefit of U.S. Patent Provisional application No. 61/992,046 filed May 12, 2014. All subject matter set forth in provisional application No. 61/992,142 is hereby incorporated by reference into the present application as if fully set forth herein.

This application claims benefit of U.S. Patent Provisional application No. 62/062,699 filed Oct. 10, 2014. All subject matter set forth in provisional application number 62/062,708 is hereby incorporated by reference into the present application as if fully set forth herein.

BACKGROUND OF THE INVENTION

Field of the Invention

This invention relates to heat dissipation and more particularly to an improved heat sink and method Background of the Invention Heat sinks comprise passive heat exchangers which cool heat source devices and equipment by dissipating heat into a surrounding medium. Heat sinks are absolute requirements to be used on devices where the heat dissipation capability of the device itself is less than its heat generation rate. Without an effective heat sink, these devices would eventually overheat, resulting in at best, reduced device performance, and at worst, total failure of the subject device.

A heat sink is designed to maximize the surface area of the heat sink which is in contact with a fluid medium, such as air, water, refrigerant, oil or the like as is well known to those skilled in the art. The method of attachment of the heat sink to the heat source influences the system cooling effectiveness. Attachment of heat sinks to the heat source devices comprise a wide variety of methods and materials. Thermally conductive tapes or epoxy materials, wire form "z-clips", flat spring clips, stand off spacers and push pins, may be used, however threaded screw mounting is considered one of the most favorable methods of mounting. Thermal interface materials such as thermal adhesives and greases may be used to fill any air gaps between the heat source device and the heat sink.

Heat sinks may dissipate heat by conduction, convection and/or radiation. Heat sink materials, shape and color all influence the ultimate effectiveness of the heat sink in any given fluid medium. The most commonly used heat sink materials are aluminum alloys. Copper has about twice the thermal conductivity of aluminum as well as faster more efficient heat absorption. Additionally copper is highly corrosion, biofouling and microbial resistant. Some composite materials having high thermal conductivity values have been used in heat sinks. Heat sink shapes are generally conductive thick plates, finned devices or the like. Finally, heat sink surface color determines the effectiveness of radiation cooling. Shiny metal heat sinks have low emissivity, whereas matte black surfaces have high emissivity values, resulting in greater radiation heat transfer.

There have been many in the prior art who have attempted to solve these problems with varying degrees of success. None, however completely satisfies the requirements for a complete solution to the aforestated problem.

Therefore, it is an object of the present invention to provide an improved heat sink that furthers the needs of the art.

Another object of this invention is to provide an improved heat sink which may be constructed in a wide variety of shapes.

Another object of this invention is to provide an improved heat sink that is easy to install.

Another object of this invention is to provide an improved heat sink that is easy to cost effectively produce.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved heat sink for dissipating a thermal energy from a source. The source includes a source surface and a source aperture. The heat sink comprises a metallic pin extending between a proximal end and a distal end. A lower pin stud is positioned adjacent to the proximal end. An upper pin stud is positioned adjacent to the distal end. A base flange is interposed between the lower pin stud and the upper pin stud and defines a lower base surface and an upper base surface. The lower pin stud engages the source aperture and the lower base surface engages the source surface. A composite pitch fiber encapsulates the upper pin stud and the upper base surface. The metallic pin and the composite pitch fiber transfer the thermal energy from the lower pin stud and the lower base surface, through the upper pin stud and through the composite pitch fiber for dissipating the thermal energy from the source.

In another embodiment of the invention, the heat sink comprises a metallic plate extending between a proximal edge and a distal edge. The metallic plate defines a primary surface, a secondary surface, a leading edge and a trailing edge. A base flange is adjacent to the proximal edge for engaging the source. A composite pitch fiber encapsulates the metallic plate for defining an airfoil shape. The metallic plate and the composite pitch fiber transfer the thermal energy from the metallic plate and through the composite pitch fiber for dissipating the thermal energy from the source.

The subject invention further incorporates the method for producing a heat sink for dissipating a thermal energy including the steps comprising inserting a metallic pin into an aperture within a pin core mold. A composite pitch fiber is inserted into a cavity in a pin cavity mold. The pin core mold is coupled with the pin cavity mold for positioning the metallic pin within the cavity. The composite pitch fiber is cured around the metallic pin. The pin core mold is decoupled with the pin cavity mold. The heat sink is removed from the aperture within the pin core mold.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 1 is an isometric view of a frst embodiment of an heat sink;
FIG. 2 is a side view of FIG. 1;
FIG. 3 is a top view of FIG. 1;
FIG. 4 is a bottom view of FIG. 1;
FIG. 5 is a sectional view along line 5-5 in FIG. 2;
FIG. 17 is a view similar to FIG. 5 illustrating a first alternative metallic pin;
FIG. 18 is a view similar to FIG. 5 illustrating a second alternative metallic pin;
FIG. 19 is a view similar to FIG. 5 illustrating a third alternative metallic pin;
FIG. 20 is an isometric view of a second embodiment of an heat fin;
FIG. 21 is a side view of FIG. 20;
FIG. 22 is a top view of FIG. 20;
FIG. 23 is a bottom view of FIG. 20;
FIG. 24 is a sectional view along line 21-21 in FIG. 22;
FIG. 25 is an isometric view of a metallic plate of FIG. 23;
FIG. 26 is a side view of FIG. 25;
FIG. 27 is a top view of FIG. 25;
FIG. 28 is an isometric view of a pin core mold;
FIG. 36 is a section view of an unmanned aerial vehicle wherein the heat sink of FIG. 1 is utilized with a thermal slug and conductive rope;
FIG. 37 is an enlarged view of FIG. 34.

Similar reference characters refer to similar parts throughout the several Figures of the drawings.

DETAILED DISCUSSION

Figure 8:
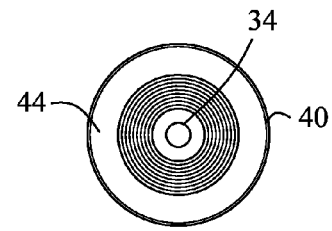
FIG. 8 is a top view of FIG. 6.
Figure 6:
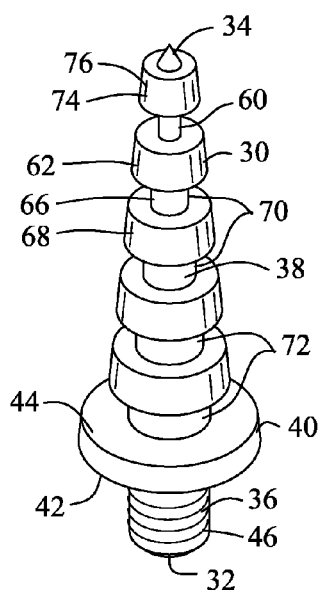
FIG. 6 is an isometric view of a metallic pin of FIG. 1.
Figure 7:
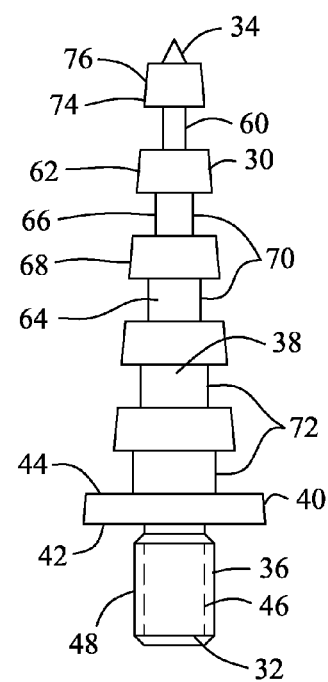
FIG. 7 is a side view of FIG. 6.
Figure 9:
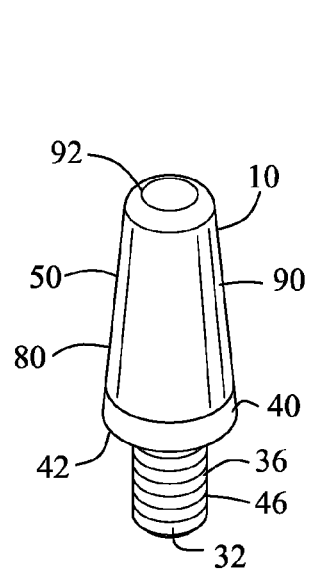
FIG. 9 is an isometric view of heat sink with a reduction in size.
Figure 11:
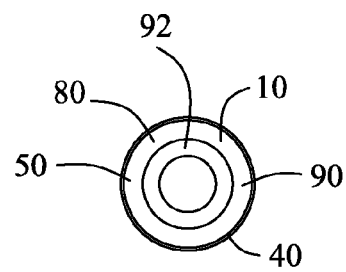
FIG. 11 is a top view of FIG. 9.
Figure 10:
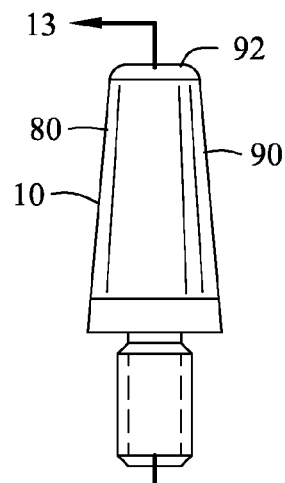
FIG. 10 is a side view of FIG. 9.
Figure 13:
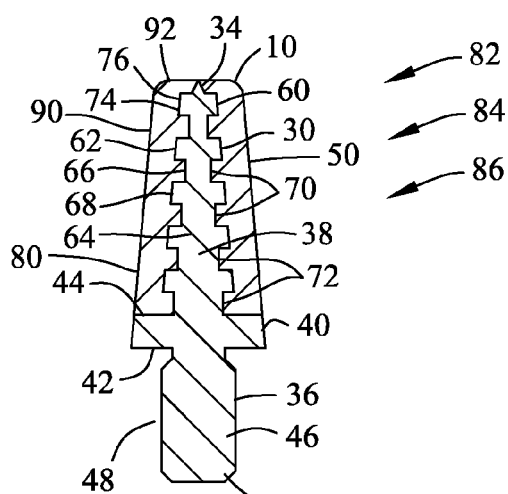
FIG. 13 is a sectional view along line 13-13 in FIG. 10.
Figure 12:
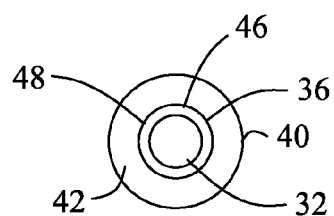
FIG. 12 is a bottom view of FIG. 9.
Figure 16:
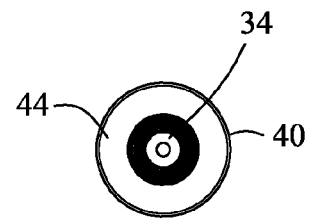
FIG. 16 is a top view of FIG. 14.
Figure 14:
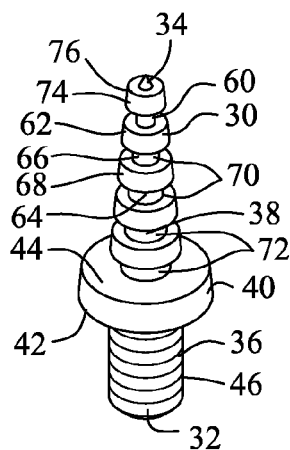
FIG. 14 is an isometric view of a metallic pin of FIG. 9.
Figure 15:
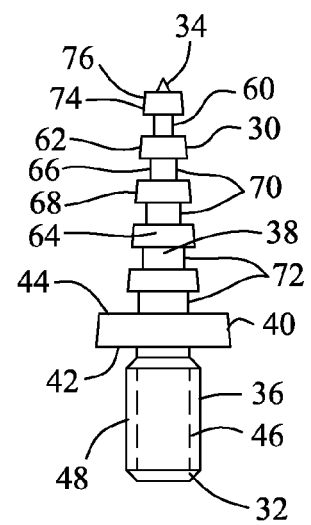
FIG. 15 is a side w of FIG. 14.
Figure 29:
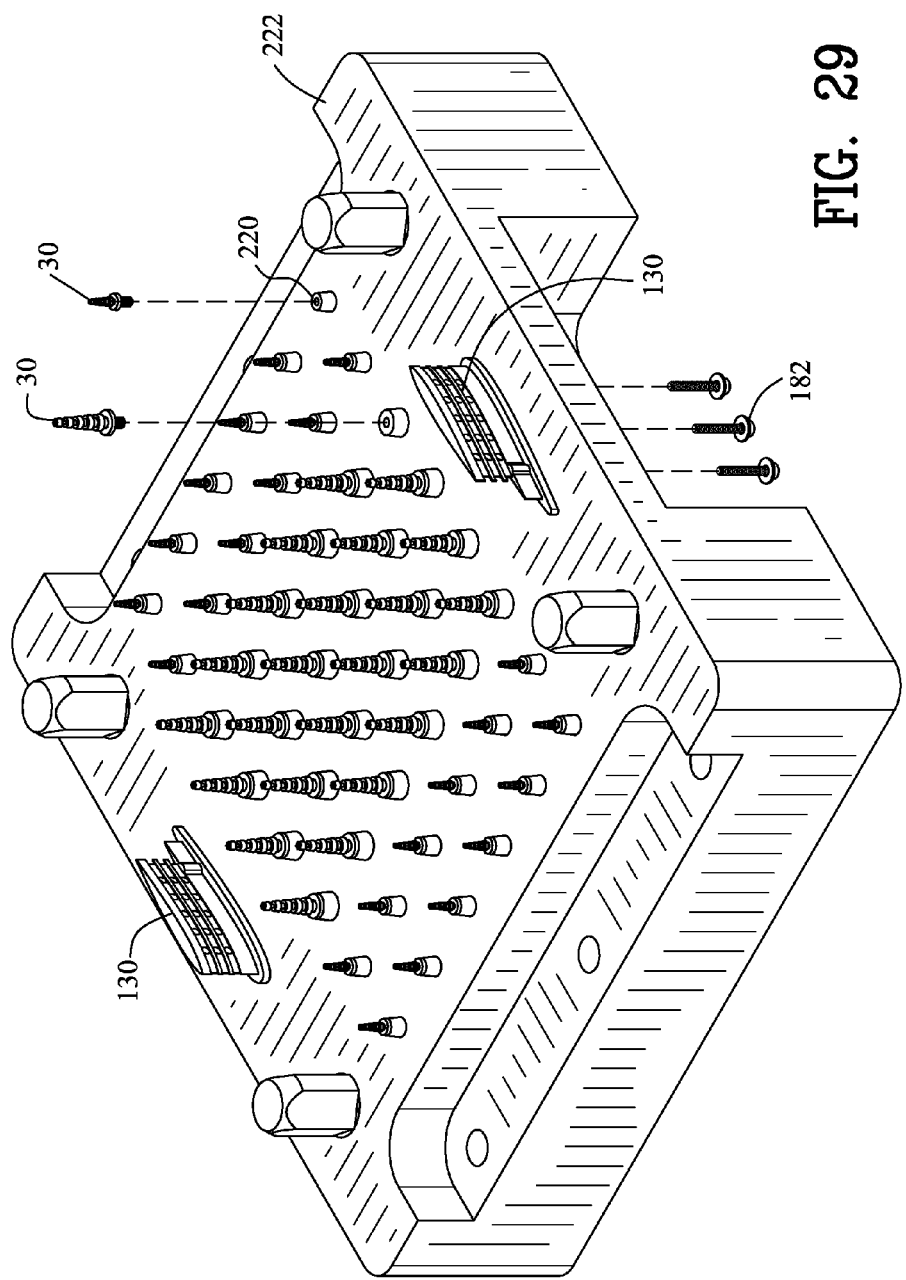
FIG. 29 is a view similar to FIG. 28, illustrating a pluralitymetallic pins threadably engaging into the pin core mold and a plurality of thsteners threadably engaging into a plurality of metallic plates.
Figure 30:
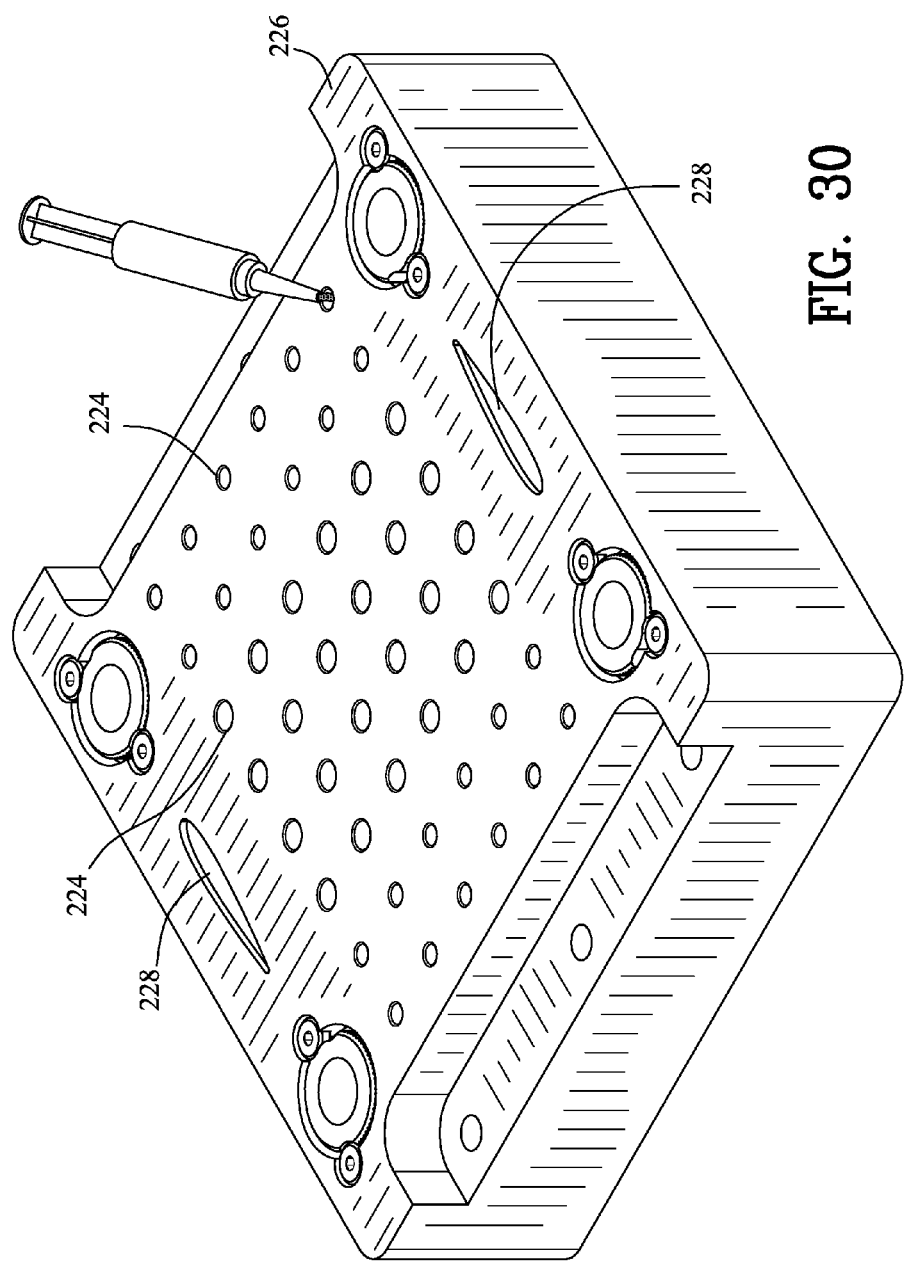
FIG. 30 is an isometric view of a pin cavity mold wherein a composite pitch fiber is inserted into a cavity within the pin cavity mold.
Figure 31:
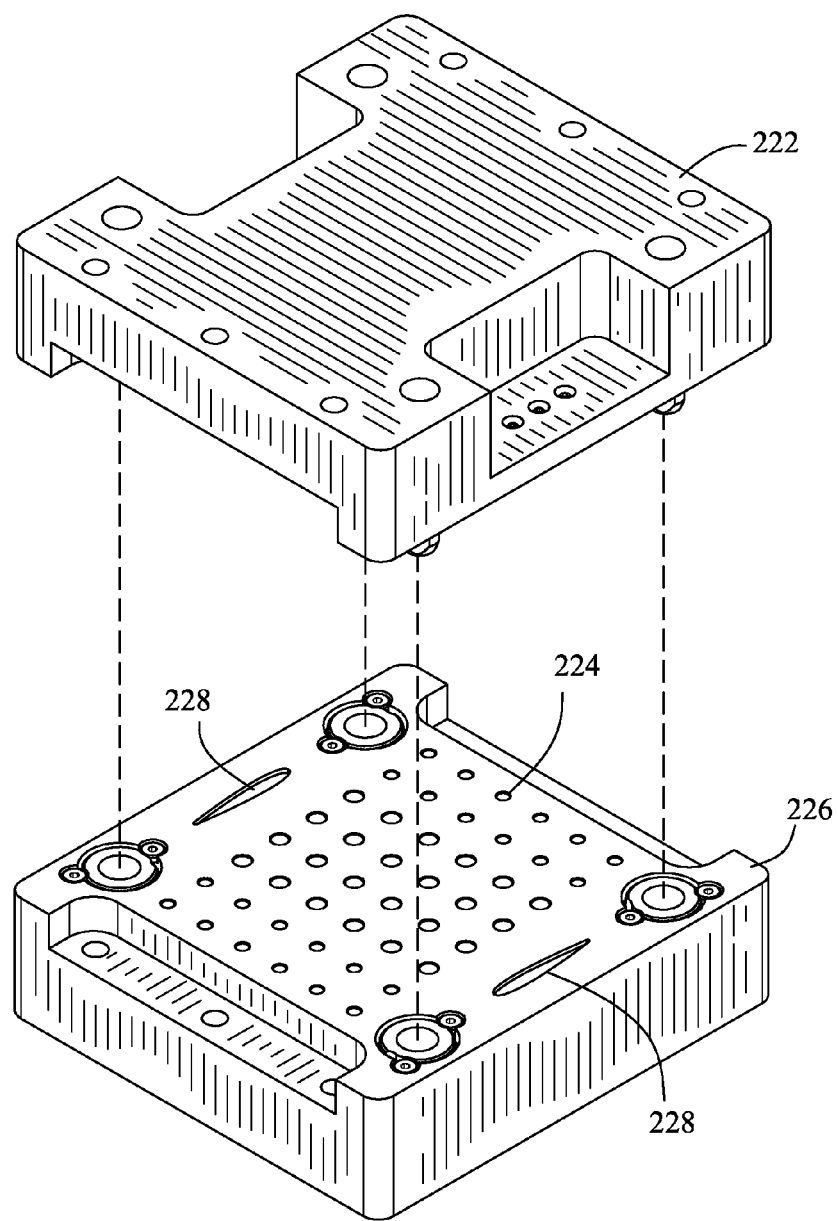
FIG. 31 is a view similar to FIG. 30 wherein the pin core mold is positioned to engage the pin cavity mold.
Figure 32:
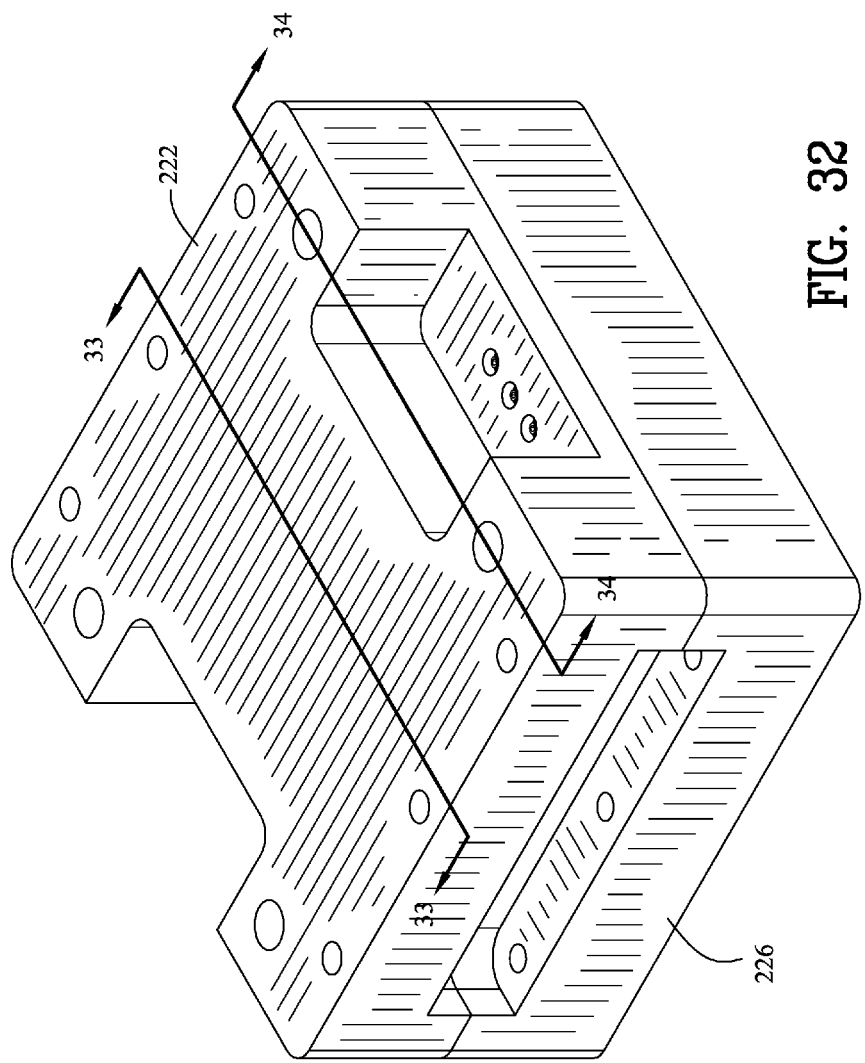
FIG. 32 is a view similar to FIG. 31 wherein the pin core mold and the pin cavity mold are compressed together.
Figure 33:
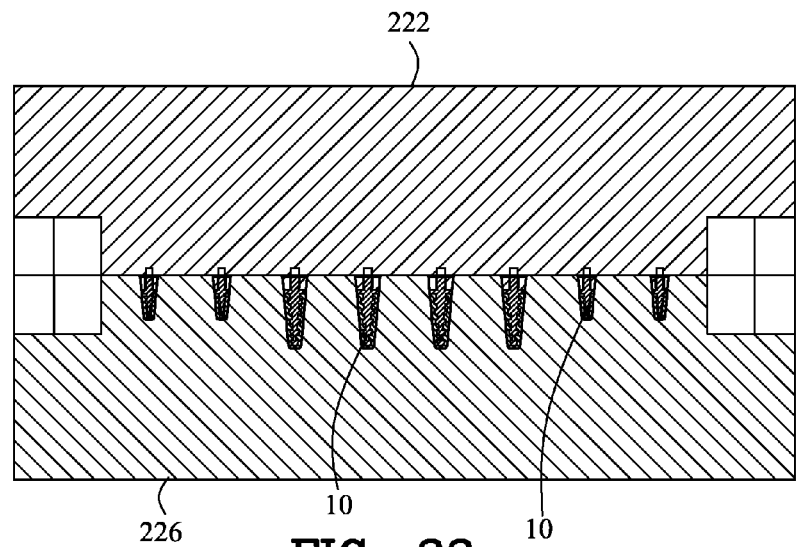
FIG. 33 is a sectional view along line 33-33 in FIG. 32.
Figure 34:
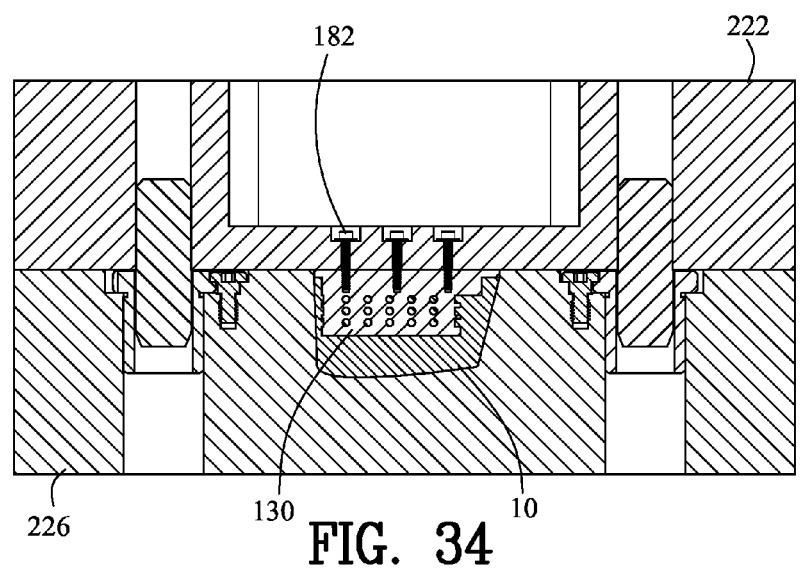
FIG. 34 is a sectional view along line 34-34 in FIG. 32.

FIGS. 1-19 illustrate a first embodiment of a heat sink 10 for dissipating a thermal energy 12 from a source 20. The source 20 includes a source surface 22 and a source aperture 24. The heat sink 10 comprises a metallic pin 30 extending between a proximal end 32 and a distal end 34. A lower pin stud 36 is positioned adjacent to the proximal end 32. An upper pin stud 38 is positioned adjacent to the distal end 34. A base flange 40 is interposed between the lower pin stud 36 and the upper pin stud 38 and defines a lower base surface 42 and an upper base surface 44. The lower pin stud 36 engages the source aperture 24 and the lower base surface 42 engages the source swface 22. A composite pitch fiber 50 encapsulates the upper pin stud 38 and the upper base surface 44. The metallic pin 30 and the composite pitch fiber 50 transfer the thermal energy 12 from the lower pin stud 36 and the lower base surface 42, through the upper pin stud 38 and through the composite pitch fiber 50 for dissipating the thermal energy 12 from the source 20.

The lower pin stud 36 may include a threaded surface 46 for threadably engaging the source 20. Alternatively, the lower pin stud 36 includes a smooth surface 48 for press fitting into the source 20. The upper pin stud 38 may include a plurality of circular grooves 60 for defining a plurality of pin bodies 62. The plurality of circular grooves 60 define a pin column 64 having a pin column surface 66. The plurality of pin bodies 62 defining a body surface 68. The plurality of pin bodies 62 and the pin column 64 couple the metallic pin 30 to the composite pitch fiber 50 and increasing the contact surface area between the metallic pin 30 and the composite pitch fiber 50 for increasing the transfer of the thermal energy 12 from the metallic pin 30 to the composite pitch fiber 50.

The pin column 64 may include a stepping dimension 70 for defining a decreasing thickness 72 in the pin column 64 from the base flange 40 to the distal end 34 of the metallic pin 30. The body surface 68 includes a tapering outer surface 74 for defining a decreasing thickness 76 in the plurality of pin bodies 62 from the base flange 40 to the distal end 34 of the metallic pin 30.

The composite pitch fiber 50 defines an outer composite surface 80. The tapering outer surface 74 and the outer composite surface 80 defining a parallel orientation 82 for providing a uniform dimension 84 between the tapering outer surface 74 and the outer composite surface 80 between the base flange 40 and the distal end 34. The parallel orientation 82 provides a uniform transfer 86 of the thermal energy 12 from the metallic pin 30 and into the composite pitch fiber 50.

The outer composite surface 80 may defines a conical outer shape 90 decreasing in a cross-sectional dimension from base flange 40 to the distal end 34 of the metallic pin 30. The distal end 34 of the metallic pin 30 may includes a conical end 92 for increasing the contact surface area between the metallic pin 30 and the composite pitch fiber 50 and increasing the transfer of the thermal energy 12 from the metallic pin 30 to the composite pitch fiber 50.

FIG. 17 illustrates the heat sink 10 having less metallic material to allow for an increased volume of composite pitch fiber 50 and thus increasing the dissipation of the thermal energy 12 through the heat sink 10. The heat sink of FIG. 18 includes a channel 100 traversing the lower pin stud 36, the base flange 40 and the upper pin stud 38. A composite pitch fiber rod 102 is positioned within the channel 100. The composite pitch fiber and 30 and the composite pitch fiber rod 102 are integrally formed for permitting the transfer of the thermal energy 12 through the composite pitch fiber rod 102 and through the composite pitch fiber 50 for dissipating the thermal energy 12 from the source 20. FIG. 19 illustrates the upper pin stud 38 of the heat sink 10 coupled to the composite pitch fiber 50 via a sill for a proxy or other conductive adhesives.

Figure 35:
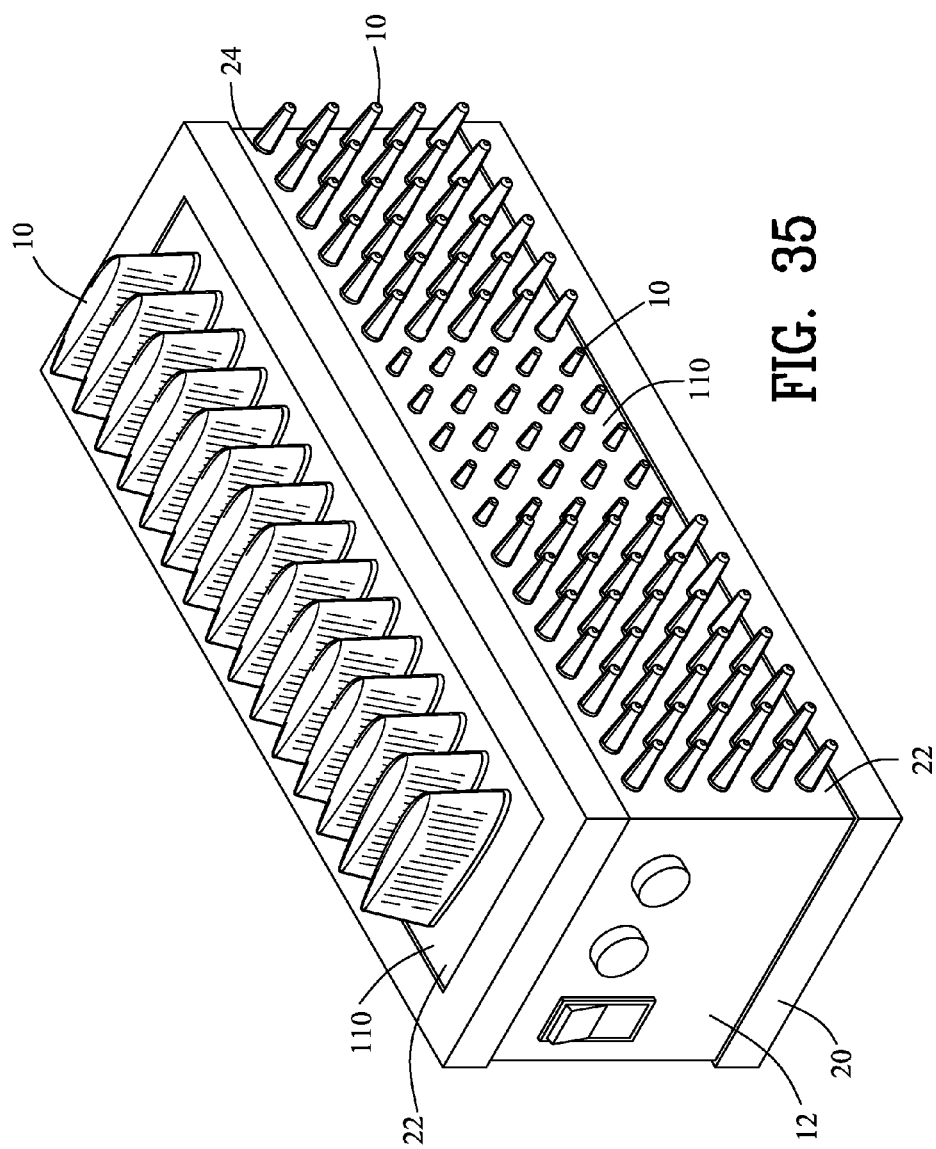
FIG. 35 is an isometric view of a container generating thermal energy wherein a plurality of heat sinks of FIG. 1 and a plurality of heat fins of FIG. 20 are coupled to the source.
Figure 38:
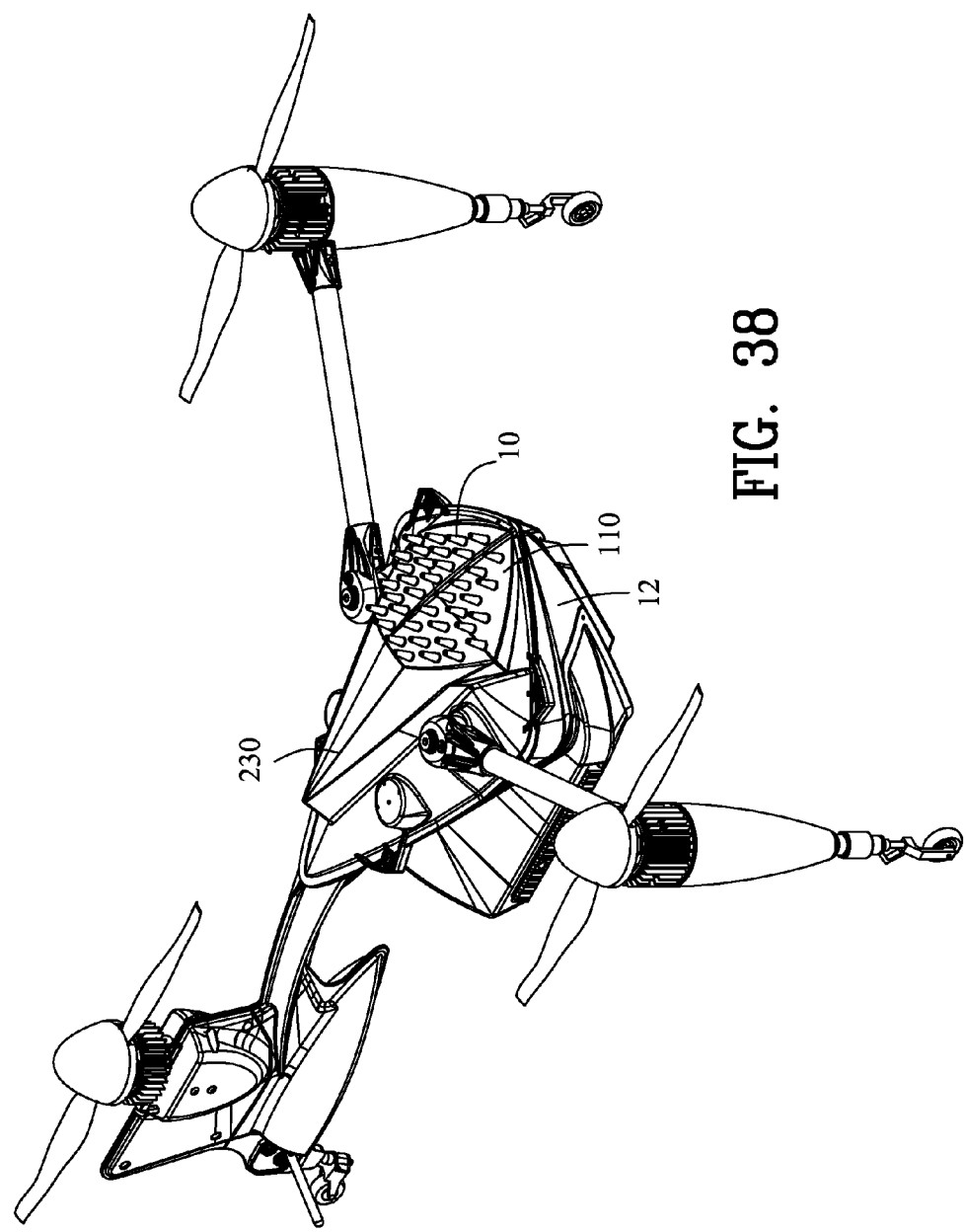
FIG. 38 is an isometric view of a unmanned aerial vehicle wherein the heat sink of FIG. 1 is utilized with a thermal plate mounted on the unmanned aerial vehicle.

FIGS. 35 and 38 illustrate a thermal plate 110 butting the source 20. A plurality of lower pin studs 36 engage the thermal plate 110. A plurality of the composite pitch fiber 50 encapsulate the plurality of the lower pin studs 36. The plurality metallic pins 30 and the plurality of composite pitch fibers 50 transfer the thermal energy 12 from the thermal plate 110, through the plurality of metallic pins 30 and through the plurality of composite pitch fiber 50 for dissipating the thermal energy 12 from the source 20.

FIGS. 36 and 37 illustrate a thermal slug 112 for butting the source 20. The lower pin stud 36 engages a remote aperture 114 and the lower base surface 42 engaging a remote surface 116. A conductive rope 118 couples the lower pin stud 36 with the thermal slug 112. The thermal slug 112 transfers the thermal energy 12 through the conductive rope 118, through the lower pin stud 36, into the upper pin stud 38 and through the composite pitch fiber 50 for dissipating the thermal energy 12 from the source 20.

FIGS. 20-27 illustrate a second embodiment of the subject invention. The heat sink 10 comprises a metallic plate 130 extending between a proximal edge 132 and a distal edge 134. The metallic plate 130 defines a primary surface 140, a secondary surface 142, a leading edge 144 and a trailing edge 146. A base flange 150 is adjacent to the proximal edge 132 for engaging the source 20. A composite pitch fiber 50 encapsulates the metallic plate 130 for defining an airfoil shape 160. The airfoil shape 160 includes primary airfoil surface 162, a secondary airfoil surface 164, a leading airfoil edge 164 and a trailing airfoil edge 168. The metallic plate 130 and the composite pitch fiber 50 transfer the thermal energy 12 from the metallic plate 130 and through the composite pitch fiber 50 for dissipating the thermal energy 12 from the source 20.

The metallic plate defines an airfoil shape 136. A plurality of threaded apertures 180 are within the metallic plate 130. A plurality of threaded fastener 182 traverse the source 20 and threadably engaging within the plurality of threaded apertures 180 for coupling the metallic plate 130 to the source 20. The airfoil shape 160 in the composite pitch fiber 50 providing good laminar airflow around the airfoil shape 160.

The metallic plate 130 may includes a plurality of grooves 190 for defining a plurality of recessed surfaces 192 and a plurality of raised surfaces 194. The plurality of recessed surfaces 192 and the plurality of raised surfaces 194 couple the metallic plate 130 to the composite pitch fiber 50 and increase the contact surface area between the metallic plate 130 and the composite pitch fiber 50 for increasing the transfer of the thermal energy 12 from the metallic plate 130 to the composite pitch fiber 50.

The plurality of recessed surfaces 192 include a plurality of apertures 196 traversing the metallic plate 130. The plurality of apertures 196 couple the metallic plate 130 to the composite pitch fiber 50 and increasing the contact surface area between the metallic plate 130 and the composite pitch fiber 50 for increasing, the transfer of the thermal energy 12 from the metallic plate 130 to the composite pitch fiber 50.

The primary surface 140 includes a primary arcuate riser 200. The secondary surface 142 includes a secondary arcuate riser 202. The primary arcuate riser 200 and the secondary arcuate riser 202 couple the metallic plate 130 to the composite pitch fiber 50 and increasing the contact surface area between the metallic plate 130 and the composite pitch fiber 50 for increasing the transfer of the thermal energy 12 from the metallic plate 130 to the composite pitch fiber 50.

The tailing edge 146 may include a metallic plate extension 204. The base flange 150 is adjacent to the metallic plate extension 204. The metallic plate extension 204 couples the metallic plate 130 to the composite pitch fiber 50 and increasing the contact surface area between the metallic plate 130 and the composite pitch fiber 50 for increasing the transfer of the thermal energy 12 from the metallic plate 130 to the composite pitch fiber 50.

The airfoil shape 160 of the composite pitch fiber 50 and the airfoil shape 136 of the metallic plate 130 defining a parallel orientation 210 for providing a uniform dimension 212 between an outer surface 170 of the composite pitch fiber 50 and an outer surface 152 of the metallic plate 130. The parallel orientation 210 providing a uniform transfer 214 of the thermal energy 12 from the metallic plate 130 and into the composite pitch fiber 50.

Figure 39:
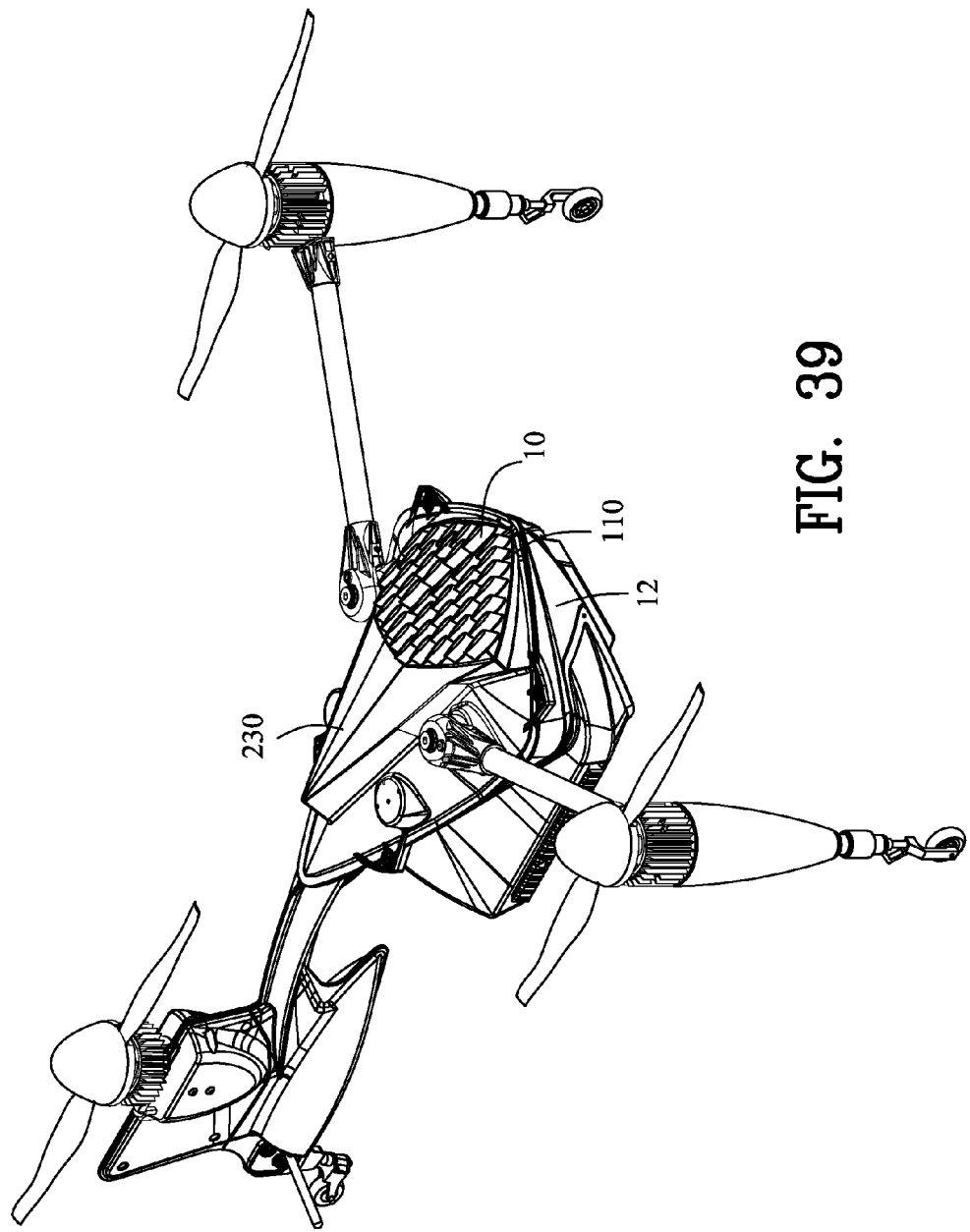
FIG. 39 is a similar view of FIG. 38 illustrating the heat In of FIG. 20 is utilized with a thermal plate mounted on the unmanned aerial vehicle.
Figure 40:
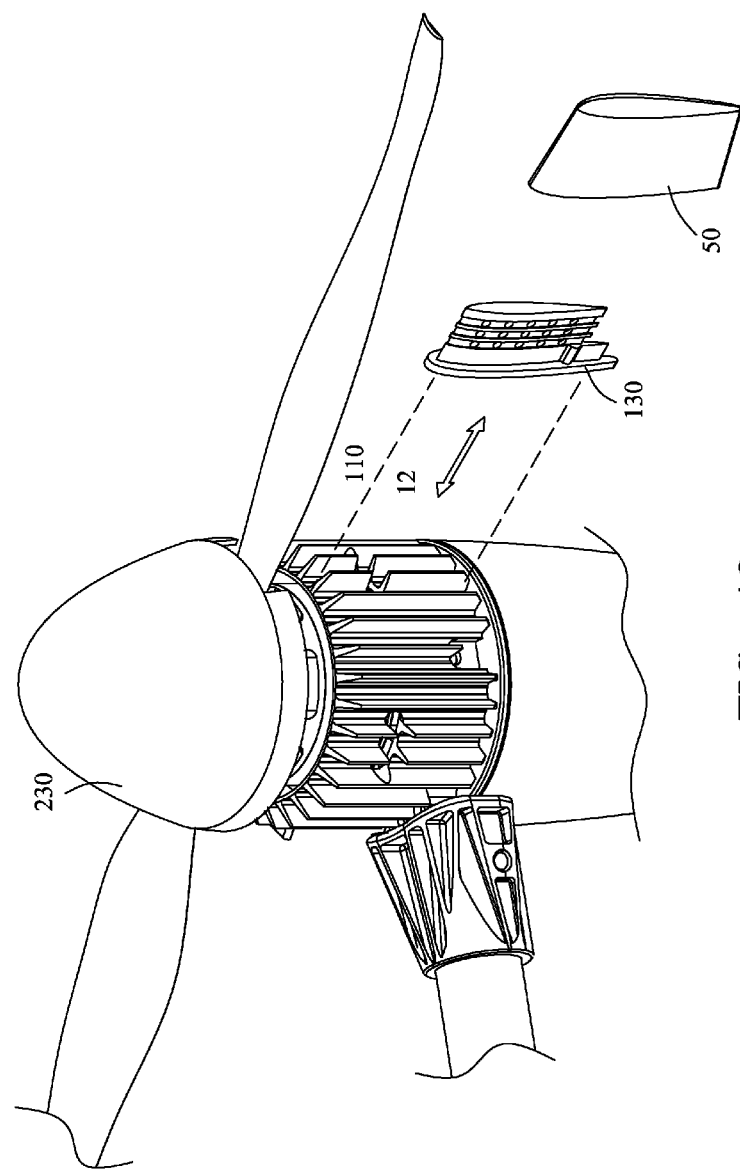
FIG. 40 is an exploded view of the heat fin of FIG. 20 utilized with a motor mount of a unmanned aerial vehicle.

As shown in FIGS. 35, 39 and 40, a thermal plate 110 may engage the source 20. A plurality of metallic plates 130 may engage the thermal plate 110. A plurality of the composite pitch fiber 50 encapsulate the plurality of the metallic plates 130. The plurality metallic plates 130 and the plurality of composite pitch fibers 50 transfer the thermal energy 30 from the thermal plate 110, through the plurality of metallic plates 130 and through the plurality of composite pitch fiber 50 for dissipating the thermal energy 12 from the source 20.

Also, as noted above the thermal slug 112 may but the source 20. The metallic plate 130 engages a remote surface 116. The conductive rope 118 couples the metallic plate 130 with the thermal slug 112. The thermal slug 112 transfers the thermal energy 12 through the conductive rope 118, through the metallic plate 130 and through the composite pitch fiber 50 for dissipating the thermal energy 12 from the source 20.

The subject invention incorporates the method of manufacturing the heat sink 10. As shown in FIGS. 26-34 the method for producing a heat sink 10 for dissipating a thermal energy 12 comprises the steps of inserting a metallic pin 30 into an aperture 220 within a pin core mold 222. The composite pitch fiber 50 is inserted into a cavity 224 in a pin cavity mold 226 and a plate cavity mold 228. The composite pitch fiber 50 may be inserted into the cavity 224 by a syringe. The composite pitch fiber 50 may include an overcharge volume of carbon fiber. Once the overcharged volume of carbon fiber is positioned within the cavity 224, the pressure from the pin core mold and the pin cavity mold creates a significant fiber by volume value. Achieving significant pressure on fiber in the mold is largely controlled by a pressure clearance in the mold between a shank and mold. Alternatively, the composite pitch fiber 50 may be injected molded. The pin core mold 222 is coupled with the pin cavity mold 224 for positioning the metallic pin 30 and the metallic plate 130 within the cavity 224. The composite pitch fiber 50 is cured around the metallic pin 30. The pin core mold 222 is decoupled with the pin cavity mold 226. The heat sink 10 is removed from the aperture 220 within the pin core mold 222.

The metallic pin 30 and the metallic plate 130 may be structured from copper, 6061-T6 aluminum, beryllium cast, cast magnesium, titanium Gold, Silver or platinum. The composite, which fiber 50 may include graphite, copper impregnated graphite, aluminum impregnated graphite, pitch fiber, bulky paper, graphene, carbon nano fiber, carbon nanotubes, quantum, Nippon graphite rifer, mitsubishi, cyteck, or any crystalline carbon material. The crystalline carbon may come in the following forms: composite slurries, thermoplastic composite pellet, crystalline carbon, both thermoplastic and thermoset, pre-preg unitape, pre-preg quasi-isotropic fiber, pre-impregnated crystalline carbon and metal fiber, dry fiber infused with a matrix/resin, vapor grown green fiber and a thermoset or thermoplastic matrix resin.

The subject heat sink 10 of the present invention is advantageous in that the heat sink 10 may be utilized as a retrofit for existing heat sinks or hot enclosures that fail to perform properly under their thermal conditions. Additionally, the subject heat sink 10 may be constructed of various sizes based on the thermal mass and desired results. The composite pitch fiber 50 is significantly more conductive then the metallic pin 30 allowing the composite pitch fiber 52 to convey the thermal energy 12 at a faster rate away from the source 20. The heat sink 10 is manufacture of an airfoil 136, 160 or blade shaped heat sink that utilizes a metal shank for the purpose of providing a thread-able component and structural mechanical interface to any heat source requiring dissipation and good laminar flow. This solution allows for the heat sink to be molded into an aerodynamic shape to provide superior laminar flow over a large surface area perhaps under a rotor or behind a propeller where parasitic drag is a major issue. The heat sink 10 is flexible in design and scalable allowing for anything from small to large parts to be produced such as wings, stabilizers, fins, control surfaces, ducting, domes, other fuselage components, nacelles and many more. Our solution is composed of any crystalline carbon such as graphite, graphene, nanofiber, nano-particles, buckypaper and pitch fiber. Some of the materials are particulates and others are fiber, which require orientation for optimal conductivity. These fibers are most conductive oriented on their axis perpendicular to a heat source. The fiber can be purchased in uni-directional, bi-directional, tri-axial, woven, custom woven, braided, chopped and a milled form. These materials may be infused with metal particles or fiber as well. In addition to the electrically and thermally conductive material options there are even more when it comes to the matrix (resin/binder). These matrix materials can be almost any thermoset or thermoplastic to include, epoxy, vinyl ester, PI, PA, TPU, PET, PU, PPS, PEEK and many more. Currently we are insert/compression molding the heat sinks in a vertical press; however its envisioned that for better manufacturing throughput, a faster horizontal injection style press, utilizing either a cooled barrel/heated mold for thermosets or a heated barrel with a cooled mold for thermoplastics will become the fastest and most efficient way to go. The blade tins can be surface mounted and screwed to thermal slugs or even interface via a conductive rope to a lug end that is mounted to a heat source. Relevant materials include, but axe not limited to the following:

Crystalline carbon materials:
Nippon Graphite Fiber (N6F), Pitch fiber products
Mitsubishi, Pitch fiber products
Cytec, DKD Pitch fiber products
SGL,graphite products
Buckypaper
Carbon Nano materials
Graphene
PEMTEX
Matrix Materials:
Epoxy
Vinyl Ester
PI
PA
TPU
PET
PU
PPS
PEEK As shown in FIGS. the heat sink 10 may be utilized on unmanned aerial vehicles 230. More specifically, the heat sink 10 can he utilized with Unmanned Aerial Systems to include threaded pin fin and blade fin technology into the fuselage of the aircraft. This process will also include a homogeneous bonded design placed in areas to optimize heat reduction from internal components by utilizing outside airflow. The heat sink insert will then utilize conductive rope attached to a thermal slug that transfer energy back through a thermal gap pad to and from the hot components. The hot components are not limited to UAV technology and can be used in all technology, automotive, space, computer, military fields. Some example of these products include but are not limited to: computers, motors, planes, ATR Chassis', electronics, generators, etc.

More specifically, shell of the unmanned aerial vehicle 230 and other components may be manufacture from thermally conductive slurries, pre-pregs and quasi-isotropic structures. The thermally conductive material permits the fuselage, wings and other control surfaces to be turned into heat sink structures. Other components constructed form thermally conductive material may include nose cones nacelles, domes or engine pods. The thermally conductive material will provide the maximum surface area possible with superior laminar flow to conventional heat sink solutions. In most cases due to the size and cost of tooling most parts envisioned would be manufactured by using compression molding technology. The crystalline carbon materials can be combined with other materials such as PAN fiber in-order to add more structural properties to the parts. The upper bulbous shell 20, the lower bulbous shell 120, the tail section 80 and other components can be entirely or partially composed of any crystalline carbon such as graphite, graphene, nano-fiber, nano-particles, buckypaper and pitch fiber. Some of the materials are particulates and others are fiber, which require orientation for optimal conductivity. The fibers are most conductive oriented on their axis perpendicular to a heat source. The fiber can be purchased in unidirectional, bidirectional, tri-axial, woven, custom woven, braided, chopped and in milled forms. These materials may be infused with metal particles or fiber as well. In addition to the electrically and thermally conductive material options there are even more when it comes to the matrix (resin/binder). These matrix materials can be almost any thermoset or thermoplastic to include, epoxy, vinyl ester, PI, PA, TPU, PET, PU, PPS, PEEK and many more. The upper bulbous shell 20, the lower bulbous shell 120, the tail section 80 and other components may be constructed by insert/compression molding in a vertical press; however for better manufacturing throughput, for smaller parts, a faster horizontal injection style press, utilizing either a cooled barrel/heated mold for thermosets or a heated barrel with a cooled mold for thermoplastics will become the fastest and most efficient of construction. The unmanned aerial vehicle 230 and components can be interfaced via conductive rope with lug ends to heat sources such as engines or ESC's (electronic speed controls). Relevant materials include, but are not limited to the following:

Crystalline carbon materials:
Nippon Graphite Fiber (NGF), Pitch fiber products
Mitsubishi, Pitch fiber products
Cytec, DKD Pitch fiber products
SGL, graphite products
Buckypaper
Carbon Nano materials
Graphene
PEMTEX
Matrix Materials:
Epoxy
Vinyl Ester
PI
PA
TPU
PET
PU
PPS
PEEK The Pitch fiber is available with conductivities ranging from 200 to 900 W/mK. Performance depends largely on the selected fiber orientation and matrix, through this significant weight savings and better thermal properties can he achieved. The plurality of fuselage heat fins 394 and a plurality of fuselage pin fins 396 includes the ability to physically test a custom heat sink without any significant upfront cost. Once the custom assembled heat sink per as required, the plurality of fuselage heat fins 394 and a plurality of fuselage pin fins 396 may mold a single piece, homogeneous product.

The plurality of fuselage heat tins 394 and a plurality of fuselage fins 396 provide mounting for the booms 40, 50, conical sponsor 320, 340 and motor 316, 336. The plurality of fuselage heat fins 394 and a plurality of fuselage pin fins 396 can be manufactured from any lightweight material but is optimized for thermally conductive options such as; aluminum, beryl-cast, magnesium, pitch fiber, copper, graphite. Alternatively, the plurality of fuselage heat fins 394 and a plurality of fuselage pin fins 396 may include conductive injection molded materials such as Cool Polymer's thermoplastics.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for producing a heat sink for dissipating a thermal energy, the method comprising the steps of:
    inserting a metallic pin into an aperture within a pin core mold;
    inserting composite pitch fiber into a cavity in a pin cavity mold;
    coupling said pin core mold with said pin cavity mold for positioning said metallic pin within said cavity;
    curing said composite pitch fiber around said metallic pin;
    decoupling said pin core mold with said pin cavity mold; and
    removing the heat sink from said aperture within said pin core mold.

* * * * *